(12) United States Patent
Sazzad et al.

(10) Patent No.: US 6,175,892 B1
(45) Date of Patent: Jan. 16, 2001

(54) REGISTERS AND METHODS FOR ACCESSING REGISTERS FOR USE IN A SINGLE INSTRUCTION MULTIPLE DATA SYSTEM

(75) Inventors: Sharif Mohammad Sazzad, Monmouth Junction, NJ (US); Larry Pearlstein, Newtown, PA (US)

(73) Assignee: Hitachi America. Ltd., Tarrytown, NY (US)

( * ) Notice: Under 35 U.S.C. 154(b), the term of this patent shall be extended for 0 days.

(21) Appl. No.: 09/099,989

(22) Filed: Jun. 19, 1998

(51) Int. Cl.$^7$ .................................................. G06F 12/00
(52) U.S. Cl. ............................................ 711/100; 341/100
(58) Field of Search .................................. 711/149, 100; 341/100, 101; 365/83

(56) References Cited

U.S. PATENT DOCUMENTS

| | | | |
|---|---|---|---|
| 4,769,790 | 9/1988 | Yamashita | 365/189 |
| 4,903,231 | 2/1990 | Artieri | 364/900 |
| 4,918,527 | 4/1990 | Penard et al. | 358/160 |
| 5,042,007 | 8/1991 | D'Luna | 365/78 |
| 5,177,704 | 1/1993 | D'Luna | 365/78 |
| 5,481,487 | 1/1996 | Jang et al. | 364/725 |
| 5,570,356 | * 10/1996 | Finney | 341/100 |
| 5,648,776 | * 7/1997 | Widmer | 341/100 |
| 5,708,618 | 1/1998 | Toda et al. | 365/230.05 |
| 5,721,868 | * 2/1998 | Yung | 395/476 |
| 5,926,120 | * 7/1999 | Swenson | 341/100 |

FOREIGN PATENT DOCUMENTS

| | | |
|---|---|---|
| 0 381 940 | 8/1990 | (EP) . |
| 2 317 466 | 3/1998 | (GB) . |

OTHER PUBLICATIONS

Lee, Ruby B., "Subword Parallelism with Max–2", *IEEE Micro*, vol. 16, No. 4, Aug. 1996, pp. 51–59.

* cited by examiner

*Primary Examiner*—Eric Coleman
(74) *Attorney, Agent, or Firm*—Straub & Pokotylo; Michael P. Straub

(57) ABSTRACT

Methods and apparatus for implementing single instruction multiple data (SIMD) signal processing operations are described. The apparatus of the present invention include new registers and register arrays which allow data to be accessed at a word as well as sub-word or sub-register level. The registers and register arrays of the present invention may be used when implementing a system based on a SIMD architecture. Registers implemented in accordance with the present invention include a plurality of pass gates that allow an entire n-bit word stored in the register to be accessed and output as a single word or for a sub-word portion of a stored word to be accessed and output. During standard operation the registers are accessed on a word basis. However, during column access operations, e.g., when performing a transpose operation, access is performed on a sub-word basis. The ability to access the registers of the present invention on a word or sub-word level make implementing transpose and various other row/column data manipulation operations possible in a relatively straightforward manner without data buffering. In addition to the novel registers and register arrays of the present invention, various aspects of the present invention are directed to new and novel SIMD instructions, e.g., SIMD move, add, and move instructions, which support the specification of data to be processed as operands which identify rows or columns of register arrays as opposed to merely identifying registers as done with conventional commands. A transpose command is also supported.

38 Claims, 12 Drawing Sheets

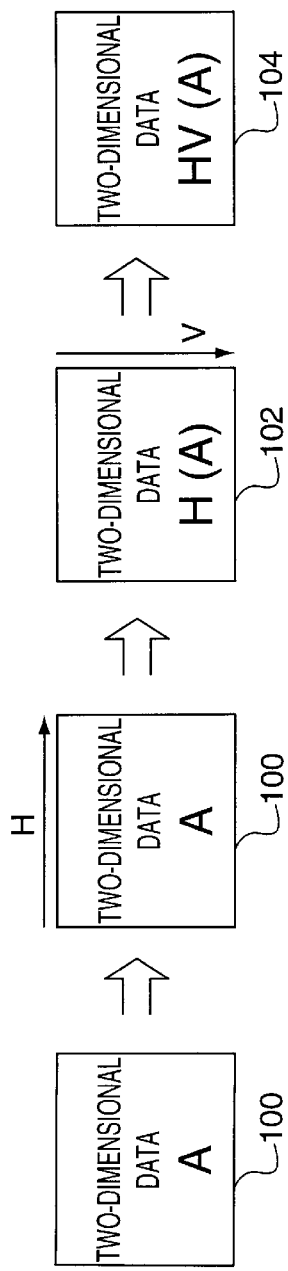
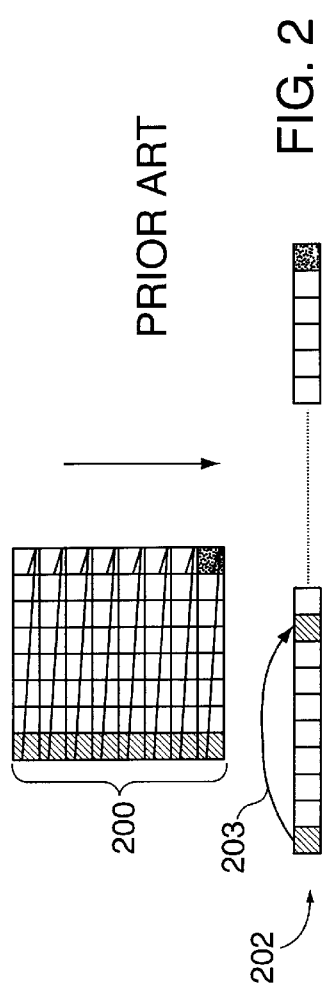
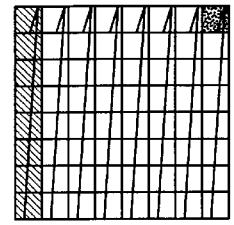
FIG. 1 PRIOR ART
FIG. 2 PRIOR ART
FIG. 3 PRIOR ART

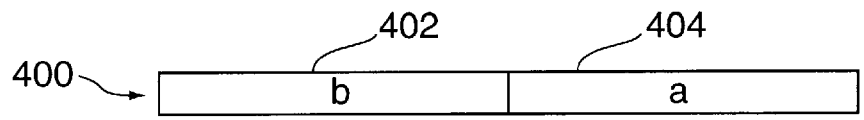
PRIOR ART    FIG. 4A
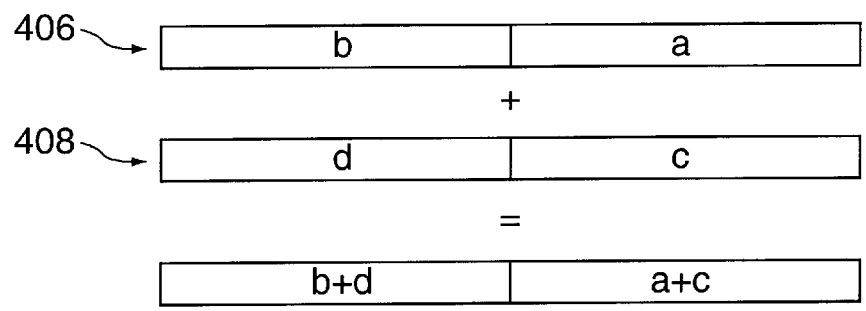
PRIOR ART    FIG. 4B
FIG. 5
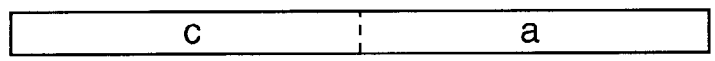
FIG. 6

# REGISTERS AND METHODS FOR ACCESSING REGISTERS FOR USE IN A SINGLE INSTRUCTION MULTIPLE DATA SYSTEM

FIELD OF THE INVENTION

The present invention relates to methods and apparatus, including, e.g., registers and register arrays, for implementing single instruction multiple data (SIMD) signal processing operations.

BACKGROUND OF THE INVENTION

The processing of two-dimensional sets of data is growing in importance as the use of computers continues to grow. Two-dimensional sets of data are frequently used to represent, e.g., images.

In the digital processing of two-dimensional signals, e.g., data sets, it is possible, for example when performing some two-dimensional filtering such as a low pass filtering operation or some two-dimensional transformation such as an inverse discrete cosine transform (IDCT) operation, to treat a two-dimensional operation as a series of two, one-dimensional operations. This is possible due to a mathematical property called separability. This separability property allows a complex two-dimensional process to be implemented as a series of two, one-dimensional processes.

Sequential one-dimensional processes tend to be far less complicated algorithms to implement, than a corresponding two-dimensional process. For this reason, the property of separability is frequently used to implement two-dimensional data processing operations. In implementing a two-dimensional operation as two, one-dimensional operations, the one-dimensional operations are applied sequentially in the horizontal and vertical directions of the data being processed. This is illustrated in FIG. 1 where the two-dimensional operation HV is implemented as two sequential processing operations H, V on the data set A 100 to produce the two-dimensional data set HV(A) 104. The intermediate data set H(A) 102 is produced as the result of the application of the horizontal function H to the data set A 100.

Suppose that data words, each represented by a separate box, are arranged in a memory in "raster-scan" order as illustrated in FIG. 2. In such an arrangement, data words beginning at the top left of a two-dimensional data array 200, following to the right and down to the bottom right data element are stored at sequential locations in memory as illustrated by the row of blocks 202 representing sequential memory locations. In processing the two-dimensional data in the horizontal direction the arrangement of the samples in the one-dimensional structure is convenient because each data sample follows the next. In order to process the data in the vertical direction it is clear from the first two shaded squares in FIG. 2 that access to the data is not as straightforward because there is a jump between the consecutive samples as represented by the arrow 203.

One known method of solving the problem of accessing the vertical rows of data for performing the vertical processing operation is to store the results from the horizontal processing operation in transposed order. This is shown in FIG. 3 wherein the shaded blocks representing a vertical column of data are now arranged horizontally.

As a result of the mathematical transpose accessing the vertical information is simple. At the end of the processing for the vertical direction, the transpose of the resulting data must normally be performed to restore the arrangement to the natural order for use in subsequent operations, e.g., the generation of video images for display.

Another method of accessing data to perform sequential horizontal and vertical data processing operations involves addressing the data that is stored in memory using a pointer that jumps to the next desired data sample. This method has the advantage, as compared to the transpose technique discussed above, that it does not require that the data undergo an additional transposition step in order to restore the natural data ordering for use in subsequent operations.

In high-performance implementations of digital signal processing algorithms, which may include various real time image processing applications, it is good practice to keep data that is being processed in hardware registers close to the main computational unit in order to minimize processing delays due to data transfer operations. The computational unit may be, e.g., a programmable signal processing core or some fixed function hardware. As a result of the "closeness" of the data registers to the computational unit, the computational unit can operate directly on the registers.

In cases where the data is not located in registers coupled closely to the computational unit, the data has to be fetched from cache or other memory and this results in reduced system performance. By keeping data which is frequently used in data registers which are directly accessible to a computational unit, a high level of computational speed can be maintained throughout the lifetime of a computation without having the computational unit stall due to data being in lower speed storage such as a cache or main memory.

Single-Instruction Multiple Data (SIMD) architecture systems allow multiple data elements to be processed simultaneously in response to a single instruction. The multiple data units may be stored in a single register. Well designed SIMD architectures can provide considerable performance advantages over more traditional Single-Instruction Single Data (SISD) architecture systems because of the simultaneous processing of multiple pieces of data made possible by the SIMD architecture. MMX technology from Intel Corporation currently in use in computer CPUs is one example of a SIMD architecture.

Unfortunately the above described techniques of performing sequential horizontal and vertical processing operations are not straightforward when the data is stored in registers in a format that is used by SIMD architectures. In such a situation, the manipulations that are required to obtain the desired data arrangement are relatively difficult to implement.

Consider for example, a SIMD architecture that operates on two data samples at the same time. In such a SIMD architecture the data samples have to be presented to the processing unit in the arrangement shown in the diagram of FIG. 4A. Here, one word 400 that is n-bits in length, contains two sub-words 402, 404, each n/2-bits in length. Even though one n-bit word 400 is presented to the processor, there are actually two pieces of data, sub-words b, a, 402, 404 that are embedded in that word 400. When presented to the SIMD processing unit, each of these halves is handled separately. This is one of the primary features of the SIMD processing.

As an example of a SIMD processing operation, suppose that it is desired to add two sets of numbers, {a, b} and {c, d} to produce {a+c} and {b+d}. In the SIMD architecture, it is possible to set up two data elements 406, 408 similar to the one shown in FIG. 4A. One of these 406 would contain the set {a, b} and the other 408 would contain the set {c, d}.

They may be presented to the SIMD processing unit for the desired addition. The processing unit treats the two halves of the input data words as independent quantities during the computation. An important consequence of this is that if the addition for the lower half overflows, the overflow will not affect the upper half. It can be seen from this example that the SIMD architecture is extremely beneficial for processing multiple pieces of data in parallel.

The inventors of the present application have discovered that various problems are encountered when one attempts to implement two-dimensional signal processing algorithms on SIMD architecture using local registers to provide high-performance signal processing implementations. For example, when processing two-dimensional signals, the SIMD architecture poses the following problem when data is to be transposed. Suppose that it is desired to obtain the transpose of the matrix:

$$\begin{bmatrix} a & b \\ c & d \end{bmatrix}$$

where the data is arranged in registers 0 and 1 as shown in FIG. 5. Note that the little-endian data scheme is used for the examples in this application, however this is simply for purposes of explanation of the invention and in no way limits the present invention to use only with little-endian data schemes. The transposed matrix will have the arrangement shown in FIG. 6.

Unfortunately, when two items of data, e.g., sub-words a and b, are packed into a conventional long register, the individual elements can not be accessed efficiently. That is, directdata access is limited to the full word (ba) and not one of the sub-words (b) or (a). This register access limitation which exists in conventional registers makes it relatively difficult to transform the data arrangement of FIG. 5 into the transposed arrangement of FIG. 6. This is because it is not possible to access directly the individual data sub-words of a conventional register.

Various known approaches to transposing data stored in registers include the use of software or the use of special transposition hardware. Software has the advantage of being flexible in that, minor modifications to the software of a program can allow the program to transpose arrays of different shapes and sizes. Unfortunately, software approaches have the major disadvantage of being relatively slow and time consuming because of the relatively large number of clock cycles required and the need to transfer and store the contents of the registers in, e.g., memory, while the register contents are being processed according to the software instructions.

Known special transposition hardware also suffers several disadvantages. These include the need to use sequential logic, e.g., logic which includes buffers or delay elements, or logic which is limited in terms of the size and/or shape of an array which can be transposed. The use of sequential logic introduces undesirable time delays while constraints on the size and shape of arrays which can be transposed limit the utility of special transposition hardware to specific applications.

In view of the above discussion, it becomes apparent that there is a need for new and improved methods and apparatus for accessing and transposing two-dimensional sets of data stored in hardware registers. It is desirable that such improved methods and apparatus be compatible with SIMD architectures and the data access requirements of such architectures. In particular, it is desirable that any new methods or apparatus allow the contents of a register to be accessed as a single unit or as a plurality of sub-units.

From a performance perspective, it is also desirable that any new methods and apparatus be capable of being implemented without the need for buffering or other temporary storage of register contents which can cause performance delays.

In addition to supporting transpose operations it is desirable that new and improved methods and apparatus for manipulating the contents of registers be capable of supporting data processing operations, other than transpose operations, which may require the manipulation of data in data units which are smaller than the full size of a utilized data register.

New SIMD instructions capable of taking advantage of the processing capabilities of any new methods and apparatus are also desirable.

SUMMARY OF THE PRESENT INVENTION

The present invention is directed to methods and apparatus for implementing single instruction multiple data (SIMD) signal processing operations. The apparatus of the present invention includes new and useful registers and register arrays suitable for use when implementing a system based on a SIMD architecture.

Registers implemented in accordance with the present invention include circuitry that allows an entire n-bit word stored in a register to be accessed and output in word or sub-word units. During standard operation the registers are accessed on a word basis. However, during column data access operations, e.g., when performing a transpose operation, access is performed on a sub-word basis. The ability to access the registers of the present invention on a word or sub-word level make implementing transpose and various other row/column data manipulation operations possible in a relatively straightforward manner without data buffering.

In addition to the novel registers and register arrays of the present invention, various aspects of the present invention are directed to new and novel SIMD instructions, e.g., SIMD move, add, and copy instructions, which support the specification of data to be processed as a row or column of a register array as opposed to merely identifying registers as done with conventional commands. A transpose instruction which accepts a register array identifier as an operand is also supported. The present invention is also directed to additional methods for accessing and using the novel registers and register arrays of the present invention.

As discussed above, various embodiments of the present invention are directed to efficient register and arrays of such registers, that allows the mathematical transposition of two-dimensional data to be performed with relatively little hardware and at high speeds without the need to use delay elements or buffers. An array of the new and novel registers of the present invention will, on occasion, be referred to herein as a two-dimensional SIMD register array. Such a register array may be used as the main work space in a SIMD processor used for high performance digital signal processing of two-dimensional signals.

The register arrays of the present invention provide a new method of transposing two-dimensional data in a high performance signal processing system. The register arrays of the present invention are able to transpose a variety of matrix shapes—not just square matrices. It is also possible for a single register array to perform the transpose of multiple matrices. It should be noted that the processing of signals with greater than two dimensions can also benefit from the present invention, by considering a two-dimensional subset of the data at a time.

The register arrays of the present invention are suitable for high speed storage during the processing of two-dimensional signals. They may also be used with a programmable computational core and/or with some fixed function computational unit.

The two-dimensional arrays of the present invention can be used, e.g., in digital image compression applications, in image filtering applications and in digital video processing operations.

Numerous additional features and embodiments of the present invention are discussed below in the detailed description which follows.

BRIEF DESCRIPTION OF THE DRAWINGS

FIG. 1 illustrates the performing of a two-dimensional processing operation on a set of data as two sequential one-dimensional operations.

FIG. 2 illustrates the storage of a two-dimensional array of data in a one-dimensional series in what is referred to in the art as "raster scan" order.

FIG. 3 illustrates the storage of a two-dimensional array of data in a one-dimensional series in what is referred to in the art as "transposed" order.

FIG. 4A illustrates a word comprising two sub-words.

FIG. 4B shows an operation involving the addition of two words, each of which comprises two sub-words.

FIG. 5 illustrates how a 2×2 array of data may be stored in the contents of two registers, each register storing a word comprising two sub-words.

FIG. 6 illustrates the contents of two registers, illustrated in FIG. 5, in transposed order.

FIGS. 20A–20D illustrate the contents of registers RA1 and RA2 of FIG. 20A at different times.

DETAILED DESCRIPTION

As discussed above, the present invention is directed to methods and apparatus for implementing single instruction multiple data (SIMD) signal processing operations. Various embodiments are directed to new and useful registers and register arrays suitable for use when implementing a system according to a SIMD architecture. The register and register arrays of the present invention allow the implementation of direct transpose and various other row/column data manipulation operations in an efficient manner without intermediate data buffering. In addition to the novel registers and register arrays of the present invention, various aspects of the present invention are directed to new and novel SIMD instructions, e.g., a SIMD transpose instruction, and methods for using the novel registers and register arrays of the present invention.

In accordance with the present invention, a hardware approach is taken to solving the problem of manipulating row/column data, e.g., to perform a transpose operation on data included in a two-dimensional array. One particular feature of the present invention is directed to circuitry that allows a general purpose register file in a SIMD architecture machine to read and/or write data into registers in a manner that allows two-dimensional data to be processed efficiently along either rows or columns. To facilitate an understanding of the SIMD register array of the present invention, a conventional register array 700, shown in FIG. 7, will first be discussed.

Figure 7:
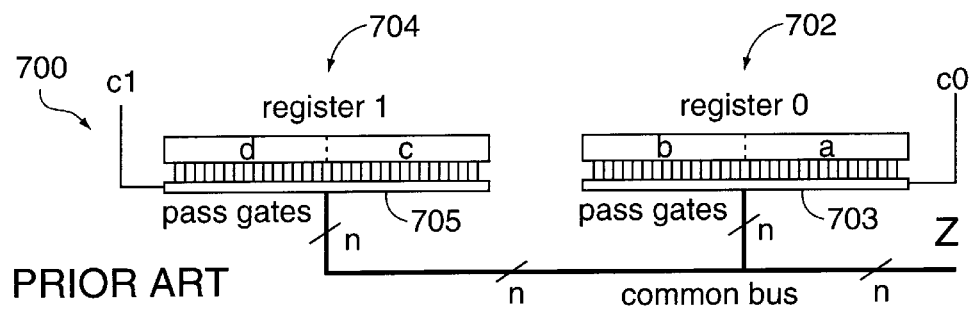
FIG. 7 illustrates a known array of two registers.

FIG. 7 illustrates a conventional register array 700 with two separate registers 702, 704, each n bits in length. The individual first and second registers 702, 704 may be accessed using the control lines which are supplied with control signals c0 and c1. The n output data lines from each of the two registers 702, 704 are joined together via a system of pass gates 703, 705, which are sometimes referred to as pass gate arrays. The term pass gate is used here to refer to a switching device. Pass gates may be implemented with, e.g., tri-state logic, and take the form of transmission gates, multiplexers, or other similar circuitry. Pass gates may be capable of bus control. Pass gates of the type used in the present invention are commonly used to allow the multiplexing of data from a number of devices while avoiding electrical conflicts. The control signals c1, c0 are supplied to the system of pass gate arrays. The appropriate manipulation of the control signals ensures proper behavior of the register array 700. Note that in the FIG. 7 example, the first and second registers 702, 704 may be part of a SIMD architecture system and that implicit within each register there are two, n/2-bit sub-words (d, c) and (b, a), respectively.

In FIG. 7, the symbol Z is used to represent an n-bit bus. The bus Z includes n data lines, $z_1, z_2 \ldots z_n$. In the known register array 700, the control signals, c0 and c1, may be used to select the contents (d, c),(b, a) of either register 702, 704 but it is not possible to obtain the sub-words a, b, c, or d separately.

In the FIG. 7 example and in various other examples included in the present application, additional control elements, e.g., logic gates, which are not illustrated, are used to manage the generation of control signals used to read and write data from the illustrated register arrays. The control elements that are not illustrated may be conventional control circuits and/or control circuits implemented in accordance with the teachings of the present invention included in this application. Such control logic may be implemented using conventional components such as logic gates and/or multiplexers (MUXes).

In the known system illustrated in FIG. 7, when accessing the first register 702 the control signal c0 is enabled while the control signal c1 is maintained in a disabled state. This causes the pass gates at the first register 702 to be enabled and those at the second register 704 to remain disabled. It is then possible to access the entire contents of the first register 702 without affecting or being affected by the second register 704. When accessing the second register 704 the control signal c1 is enabled, while the control signal c0 is maintained in a disabled state. This causes the pass gates at the second register 704 to be enabled and those at the first register 702 to remain disabled. In such a case, it is possible to access the entire contents of the second register 704 without affecting or being affected by the contents of the first register 702.

Unfortunately, as discussed above, the known register array illustrated in FIG. 7 does not allow for the sub-word elements stored therein to be directly accessed making it difficult to use such a register array when trying to individually process sub-word data elements, e.g., to perform a transpose operation.

Figure 8:
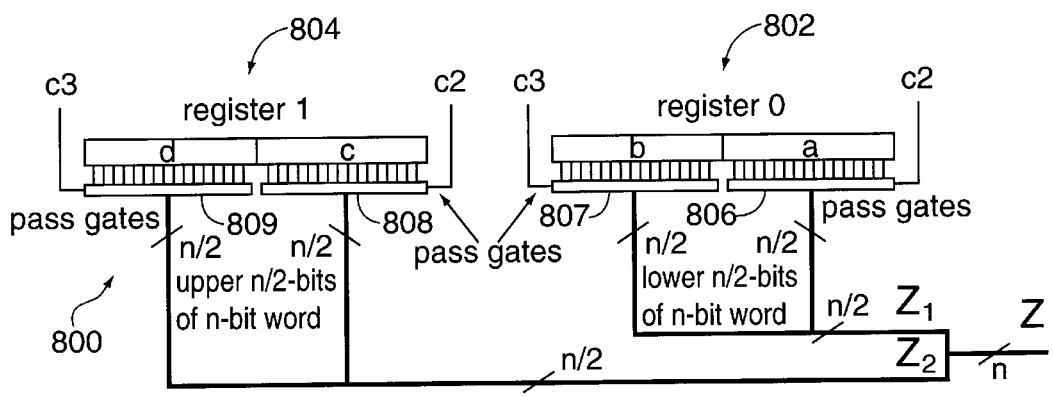
FIGS. 8, 9, and 10A illustrate register arrays implemented in accordance with the present invention.

FIG. 8 illustrates a register array 800 implemented in accordance with a first embodiment of the present invention which is designed to allow obtaining a transpose of the data stored in the register array 800 relatively easy. As illustrated the register array 800 comprises first and second register 802, 804. Each of the first and second registers 802, 804 include an n-bit word (b, a), (d, c), respectively. Note that each word is comprised of two n/2 bit sub-word as in the FIG. 7 example.

In FIG. 8 the symbols 'Z1' and 'Z2' are used to represent lower and upper sets of n/2 bus lines, respectively. In the register array 800, in accordance with the present invention, the two sub-words of each register 802, 804 are separated from the bus lines by their own set of first and second pass gates (806, 807) and third and forth pass gates (808, 809), respectively. Pass gates 806, and 808, of the first and second registers 802, 804 are controlled by the control signal c2 which may be supplied by a common control line. Pass gates 807, 809, of the first and second registers 802, 804, are controlled by the control signal c3 which may be supplied to the pass gates 807, 809 via a common control line.

At the first register 802, the n/2 lines corresponding to each of the two sub-words (b, a) are joined together following the first and second pass gates 806, 807 to form the lower n/2 bits of the full n-bit word. At the first register 802, the n/2 lines corresponding to each of the two sub-words are joined together following the pass gates 808, 809 to form the upper n/2 bits of the full n-bit word output via the combination of lines $Z_1$, $Z_2$. When c2 is enabled and c3 is disabled the n-bit bus Z formed by the combination of the lower $Z_1$ and upper $Z_2$ bus lines is allowed access to sub-words {a, c}. When the control signal c3 is enabled and c2 is disabled the n-bit bus Z is allowed access to sub-words {b, d}. Thus, the control signal and pass gate arrangement illustrated in FIG. 8 allows the transpose of the register array contents to be easily obtained.

Figure 9:
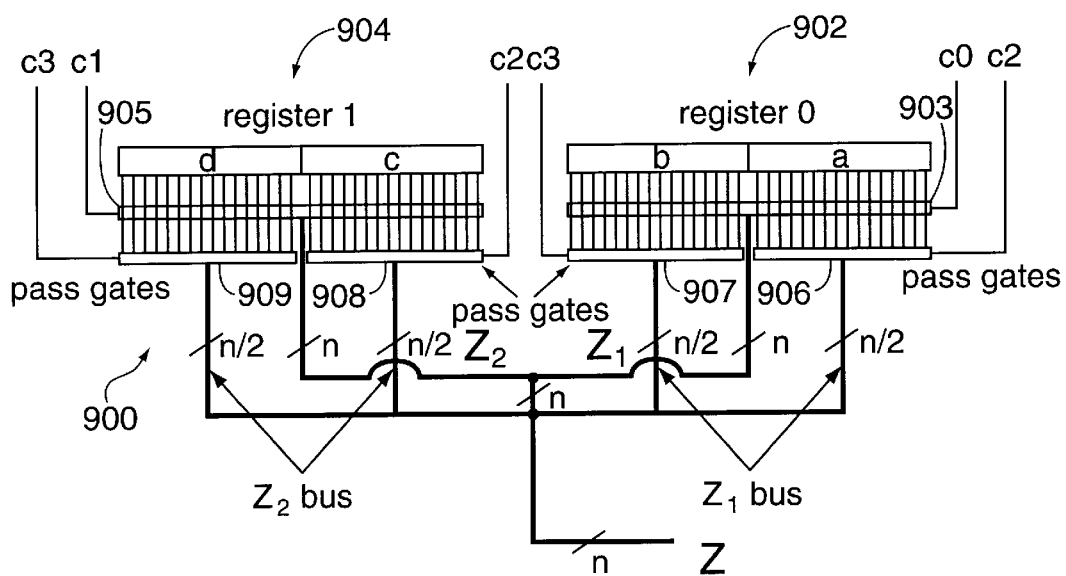

In accordance with another array register embodiment of the present invention, the pass gate features of register arrays 700 and 800 are combined to form a register array 900 illustrated in FIG. 9.

As illustrated in FIG. 9, the register array 900 includes first and second registers 902, 904. The outputs of each one of the registers 902, 904 is controlled using a set of 3 pass gates.

In the case of the first register 902, an n line pass gate 903 and two n/2 line pass gates 906, 907 are used to control the output of the first register 902. The n output lines of the pass gate 903, which is controlled by control signal c0, are coupled to the corresponding n lines of the n line bus Z. The first and second n/2 line pass gates 906, 907 have their output lines coupled to the corresponding lower n/2 lines of the bus Z.

In the case of the second register 904, an n line pass gate 905 and two n/2 line pass gates 908, 909 are used to control the output of the second register 904. The n output lines of the pass gate 905, which is controlled by control signal c1, are coupled to the corresponding n lines of the n line bus Z. The third and fourth n/2 line pass gates 908, 909 have their output lines coupled to the corresponding upper n/2 lines of the bus Z.

In the register array 900, the pass gate arrangements of the previously discussed register array circuits 700, 800, are combined so that the resulting register array 900 includes the functionality of both. That is, it is possible to access the register array 900 in the conventional manner described in regard to FIG. 7, using control signals c1 and c0, and obtain the entire words stored in registers 902, 904, one word at a time. It is also possible to access registers 902, 904 in the manner discussed with regard to FIG. 8 using control signals c2, and c3 to access one sub-word from each of the two registers 902, 904 at a time.

Thus, in accordance with the present invention, when using the register array 900 illustrated in FIG. 9, control signals c0 and c1 are used to access the first and second registers 902, 904 in the traditional manner while control signals c2 and c3 are used to access the register array in the above discussed manner which facilitates obtaining a "transpose" of the data sub-words store in registers 902, 904.

In one particular embodiment, the register array 900 of the present invention is included in programmable system where the state of the control signals c0, c1, c2, c3 are a function of a coded operand of a processing instruction being executed. Such a case will be discussed in greater detail below with reference to FIGS. 20A–20C.

When embodied in a synchronous fixed function system as opposed to a programmable system, it is contemplated that the control state of the control signals c0, c1, c2, c3 would depend on the output of a state machine implemented, e.g., using combinational and sequential logic.

Figure 10:
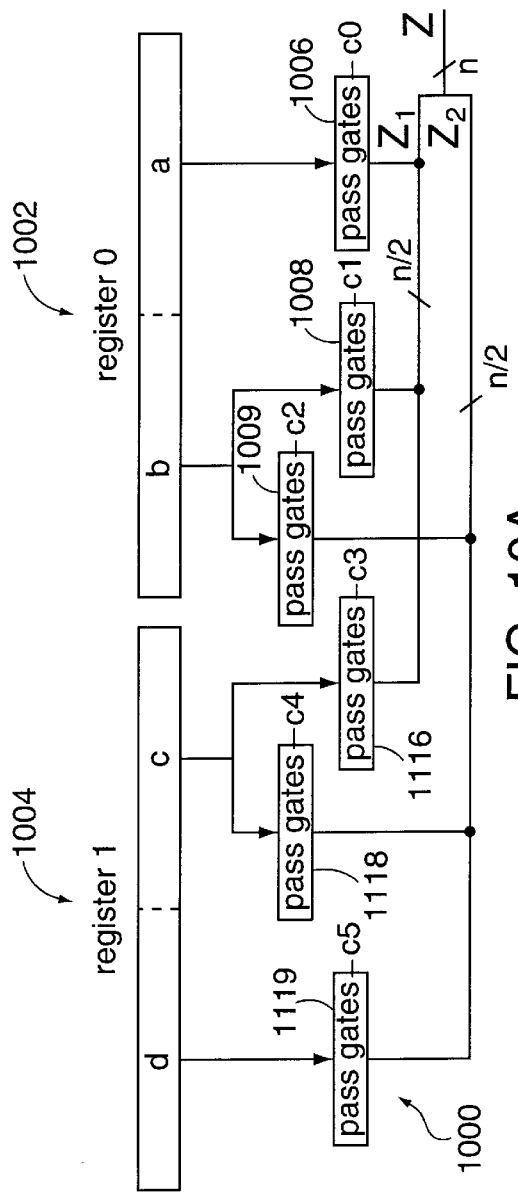
FIG. 10B is a table illustrating the values of control signals used to access data stored in the array of FIG. 10A.

FIG. 10A illustrates another two register array 1000 implemented in accordance with the present invention. In the FIG. 10A embodiment, three n/2 line pass gates 1006, 1008, 1009 are used with the first register 1002. Another three n/2 line pass gates 1016, 1018, 1019 are used with the second register 1004 of the present invention in the manner illustrated in FIG. 10A. The FIG. 10A embodiment uses a separate control signal, c0, c1, c2, c3, c4, c6, c5 to control each of the pass gates 1006, 1008, 1009, 1116, 1118, 1119, respectively. While the FIG. 10A embodiment uses the same number of pass gates as the FIG. 9 embodiment, note that the use of an n line pass gate is avoided in the FIG. 10A embodiment while two additional control signals are employed. Because of the elimination of the need n line pass gates, the FIG. 10A embodiment may offer certain hardware advantages over the FIG. 9 embodiment.

The six control signals, c0, c1, c2, c3, c4, c5 illustrated in FIG. 10A are used to manage the way the registers 1002, 1004 are accessed. FIG. 10B is a table showing the states to which the six control signals are set, e.g., by the control logic, to achieve the various data accesses operations set forth in the left side of the table. For example, in order to access the word {a, b} stored in the first register 1002, control signals c0 and c2 would be set to 1 and the remaining control signals would be set to 0.

FIGS. 9 and 10A show two exemplary circuits of the present invention each of which operates as a basic two-dimensional register array suitable for use with a SIMD architecture that partitions a single word into two sub-words.

The register arrays 900 and 1000 may be treated as an "atomic" structure in that it can serve as a building block that may be used to construct larger register arrays in accordance with the present invention.

An important feature of the FIGS. 9 and 10A register arrays is their ability to facilitate transposition of 2×2 data blocks. By arranging the atomic structure, e.g., the FIG. 9 or 10A register arrays 900, 1000 in groups, the basic two-dimensional register array 900 or 1000 may be scaled to accommodate larger data blocks.

Figure 11:
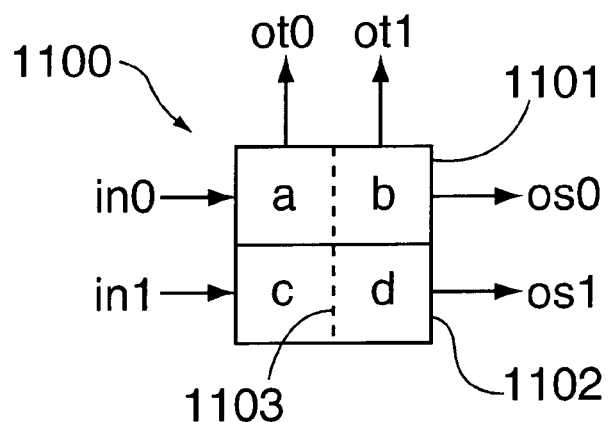
FIG. 11 is a diagram illustrating a 2×2 sub-word atomic register array unit, comprising 2 word registers, implemented in accordance with the present invention.

An atomic two-dimensional register array 1100 of the present invention, capable of being implemented e.g., using either the register arrays illustrated in FIG. 9 or 10A, is illustrated in FIG. 11. The register array 1100 comprises first and second n-bit registers 1101, 1102. Note how the dashed line 1103 alludes to the partitioned nature of the first and second SIMD registers 1101, 1102 in the array 1100, and the n/2 bit sub-word stored in each half of the SIMD register 1101, 1102.

The process of accessing a 2×2 sub-word matrix created by the register array 1100 may be visualized by considering that the data enters the register array 1100 using the word inputs in0 and in1 shown on the left. Data outputs the register array 1100 in either the standard (non transposed) manner via word outputs os0 os1, or in transposed form via word outputs ot0, ot1. In FIG. 11, "in0" stands for input number 0, "ot0" stands for transposed output number 0, and "os0" stands for standard output number 0. The two transposed outputs t0 and t1 are shown at the top of the register array 1100. The two standard outputs os0 and os1 are shown at the right side of register array 1100. The two-dimensional array 1100 may be considered to be "atomic" because it is the smallest two-dimensional register array that may be constructed in accordance with the two-partition SIMD architecture of the present invention.

Using the "atomic" structure illustrated in FIG. 11 larger register arrays may be created by combining multiple arrays 1100.

Square M×M sub-word register arrays may be implemented by using M/2×M/2 word registers of the present invention. For example, the 4×4 sub-word register array 1200 may be constructed as show in FIG. 12. As illustrated, four register arrays of the type illustrated in FIG. 11, are used to form the register array 1200.

Figure 12:
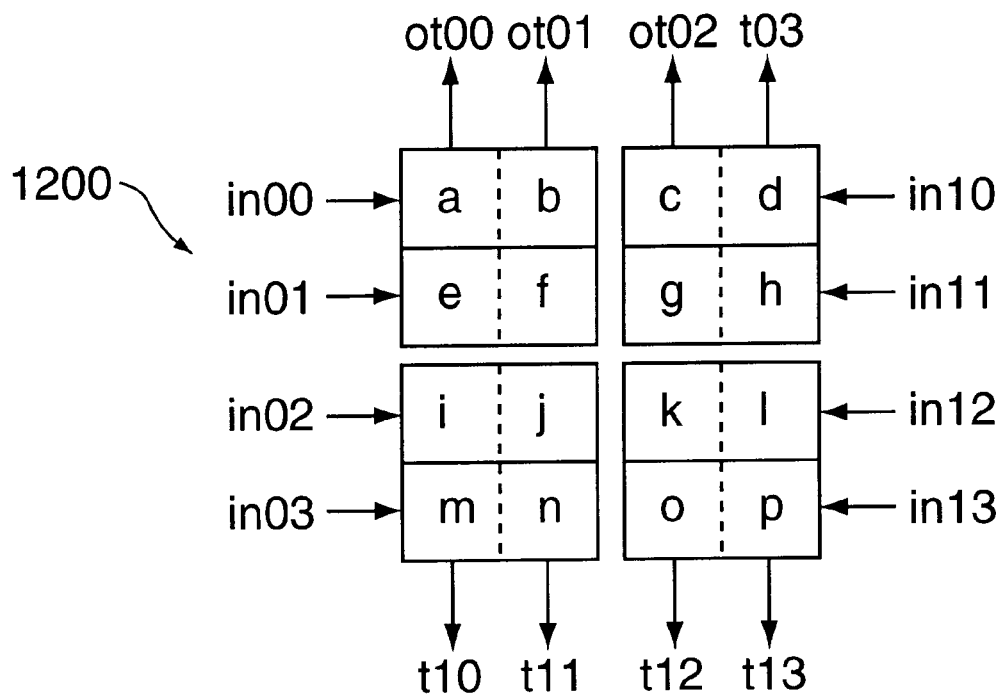
FIG. 12 illustrates a 4×4 sub-word register array implemented using four of the atomic register arrays of the present invention illustrated in FIG. 11.

Note that in FIG. 12, for illustration purposes, only the register inputs and transposed outputs are illustrated. The register array 1200 also includes standard (non-transposed) outputs which are not illustrated.

The 4×4 sub-word register array 1200 may be used to form the transpose of matrices that are up to 4×4 sub-words in size. Lower order matrices and non-square matrices may also be accommodated by the structure.

When entering data to be transposed into a register array implemented in accordance with the present invention the data should be entered in a manner that allows the transpose of the data to be obtained from the square register array 1200. For example, the array of sub-words:

$$\begin{bmatrix} a & b & c & d \\ e & f & g & h \\ i & j & k & l \\ m & n & o & p \end{bmatrix}$$

should be entered into the two-dimensional register array so that each 2×2 sub-block within the array is stored in a different one of the four atomic register units comprising the array 1200. In addition, the array contents should be stored in such a manner that the content of each 2×2 sub-block will be aligned with a boundary of an atomic register unit.

FIG. 12 illustrates a possible way to store the array of sub-words illustrated above with proper register array alignment.

As another example of array storage, consider the 2×4 rectangular sub-word array:

$$\begin{bmatrix} a & b & c & d \\ e & f & g & h \end{bmatrix}$$

Figure 13:
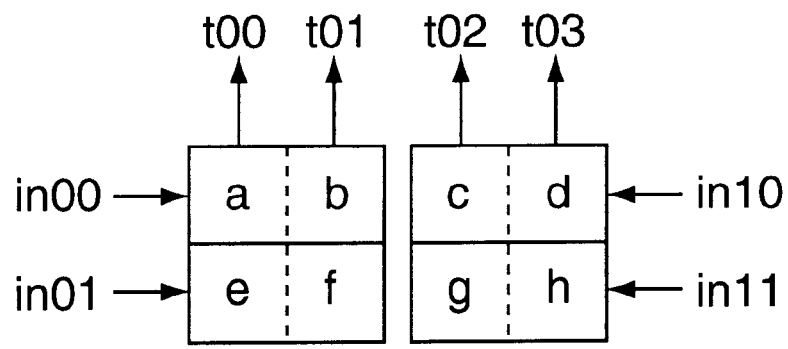
FIGS. 13 and 14 illustrate the storage of non-square data in register arrays implemented in accordance with the present invention.

In accordance with the present invention this array should be stored using the upper two register units of the array 1200 as illustrated in FIG. 13.

As a final example of using the register array 1200, consider the 3×3 array below.

$$\begin{bmatrix} a & b & c \\ d & e & f \\ g & h & i \end{bmatrix}$$

Figure 14:
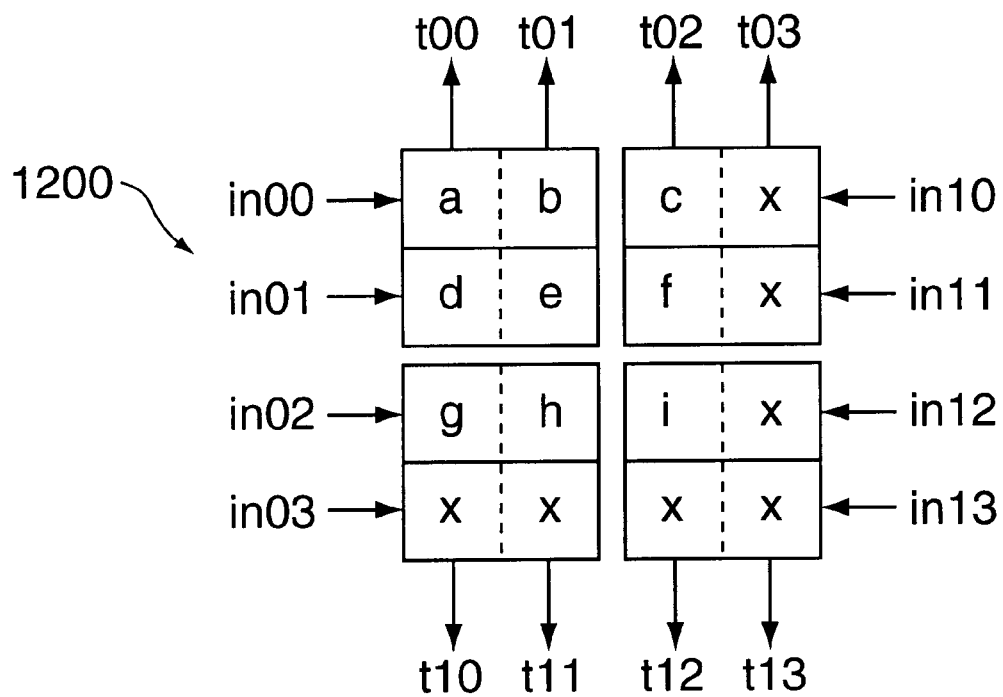

When storing the above array in the register 1200, the data should be arranged in the manner shown in FIG. 14. Note that, due to the SIMD nature of the system, half of the word registers included in the array 1200 are left with at least a portion of the register contents undefined or with "don't care" data as represented by the Xs illustrated in FIG. 14.

When the transpose outputs are taken in the FIG. 14 embodiment, it will be seen that the registers t10, t11 and t12 are defined only in the lower half because there is no valid data from the transposition operation to be placed in the upper halves.

Generally, an H by V array of n/2 bit sub-words, where H and V are positive integers, can be stored in an X×Y array of n-bit registers, arranged as an array of the atomic register units of the present invention, where:

X is:
  equal to H/2 if H is even; and
  equal to int(H/2) plus one if H is odd; and
where:
Y is:
  equal to V/2 if V is even; and
  equal to int(V/2) plus one if V is odd.

In such an implementation, for proper storage, each one of the V rows of n/2 bit sub-words to be stored is loaded into a different corresponding one of the Y rows of registers in an X×Y register array implemented in accordance with the present invention.

Figure 15:
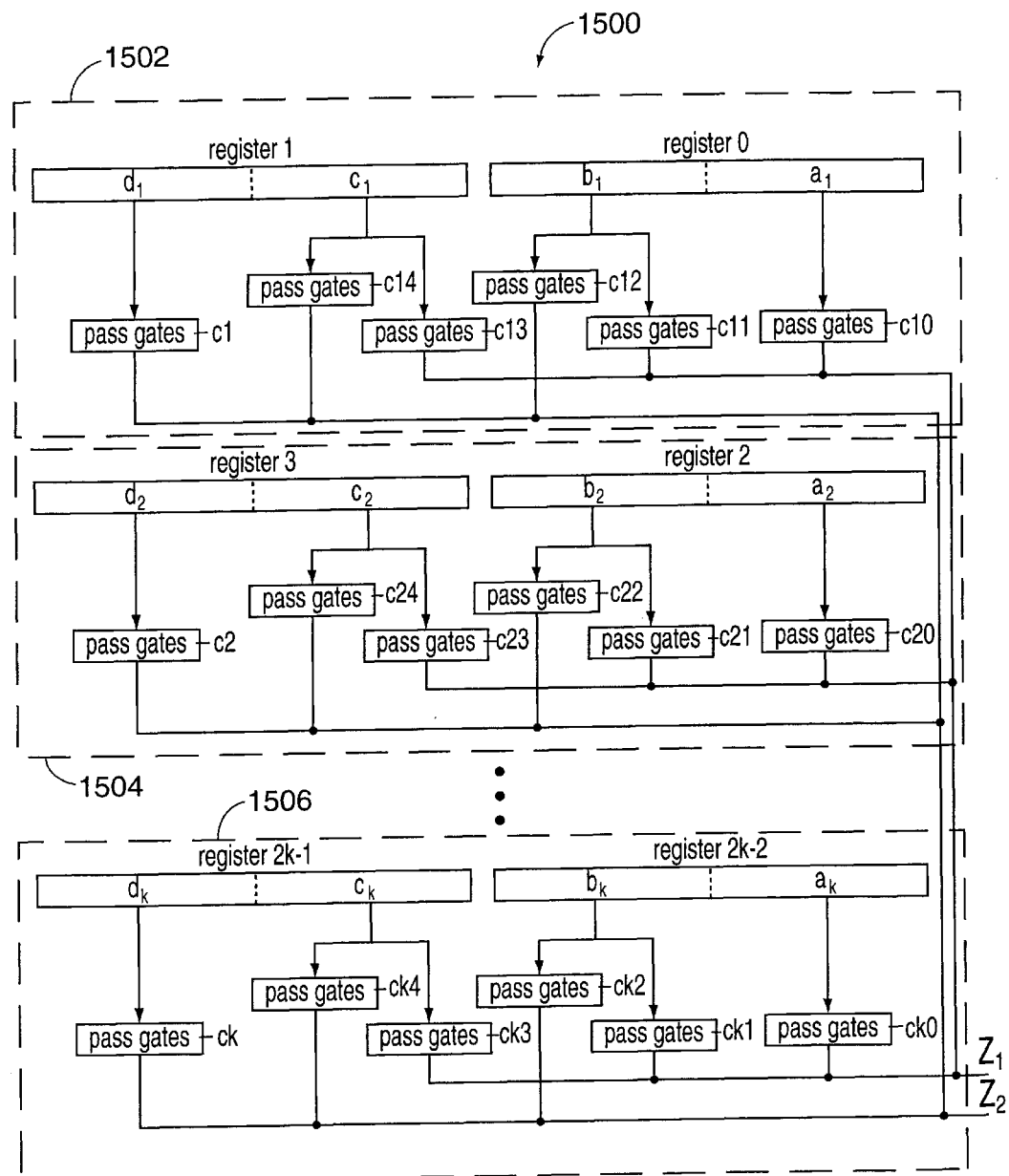
FIGS. 15–17 illustrate various register arrays implemented in accordance with different embodiments of the present invention.

Because the register array of the present invention is scalable, a register array 1500 comprising any desired even number, k, of atomic register units 1502, 1504, 1506 may be constructed as shown in FIG. 15. The control signals in FIG. 15 are operated in such a way that only the control signals, for one atomic block 1502, 1504, or 1506, are active at a given time. In the FIG. 15 embodiment, control signals are labeled as, e.g., c10, where the first number (1) identifies the atomic block, i.e., the first atomic block 1502, and the second number (0) identifies the pass gate within the block which is being controlled, i.e., the first gate in the case of the value 0.

In accordance with the present invention, the active atomic block, e.g., atomic block 1502, may be specified as an operand of a software command. The pattern of control signaling within the active atomic block, e.g., block 1502, to achieve a desired output, would be as shown in FIG. 10B.

The examples illustrated in FIGS. 9–15 are based on a SIMD architecture system in which two sub-words are included in a long word. In accordance with the present invention other partitions of a long word are possible. When implementing register arrays in accordance with the present invention, the number of partitions in a word that are to be supported will determine the size of the atomic register array of the present invention that supports such a partition arrangement and the ability to output the data in standard or transposed form.

Figure 16:
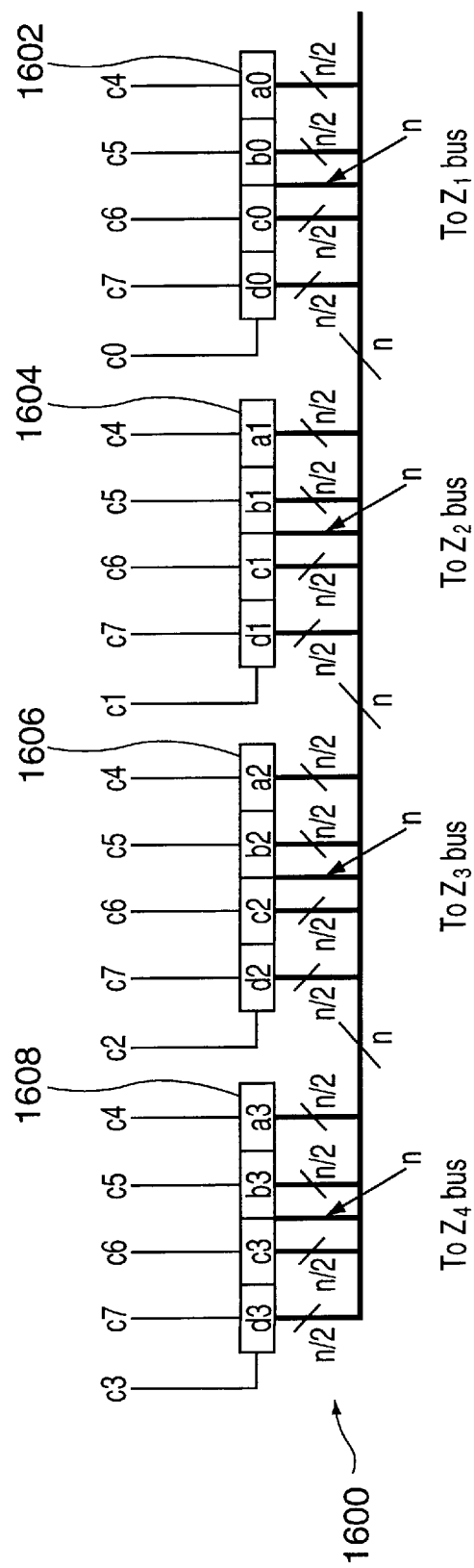

Consider, for example, a SIMD architecture that uses four partitions of a long word. In such a system, the atomic two-dimensional register array will be of sub-word order 4×4. A circuit 1600 for this atomic register array is shown in FIG. 16. Note that the atomic register array 1600 comprises four n-bit word registers 1602, 1604, 1606, 1608 the contents of which may be accessed on a word or sub-word basis where, in this embodiment, a sub-word is one fourth the size of an n-bit word. A separate n-bit pass gate is used in the FIG. 16 embodiment to control the word output of each register 1602, 1604, 1606, 1608. In addition, four n/2 line pass gates are used in conjunction with each of the four registers 1602, 1604, 1606, 1608 to control the sub-word outputs of these registers.

The architecture of the FIG. 16 register array 1600 is similar to that of the FIG. 9 register array where two sets of pass gates are used to support both traditional and transposed register access operations.

Figure 17:
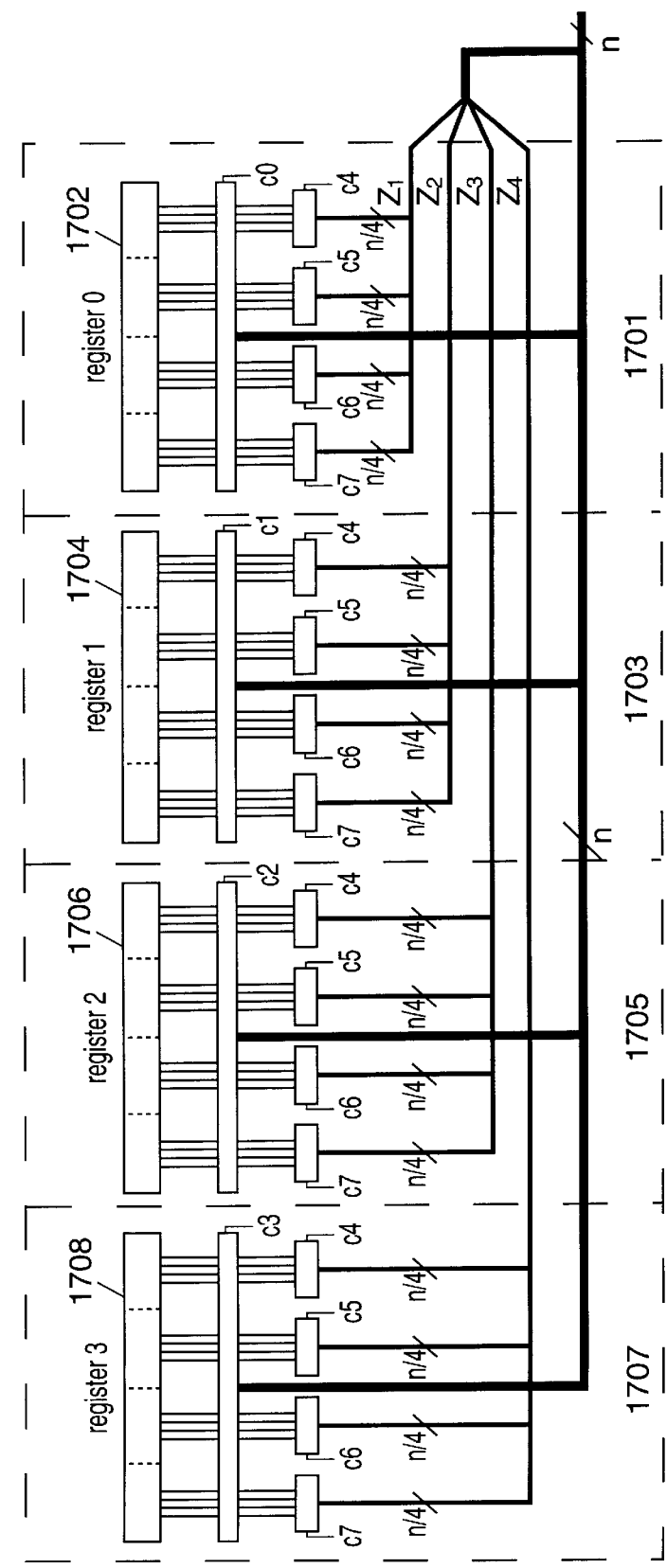

A 4×4 sub-word register array 1700 implemented in accordance with another embodiment of the present invention, can be seen in FIG. 17. The register array 1700 is implemented as four segments 1701, 1703, 1705, 1707 with each segment including an n-bit register 1702, 1704, 1706, 1708, respectively, and seven n/4 line pass gates coupled together as illustrated in FIG. 17. Note that in each of the segments 1702, 1704, 1706, 1708 the sub-word outputs of three of the four sub-words stored in the segment's n-bit register are coupled to two different n/4 line pass gates included in the segment while one of the four sub-words stored in the register is coupled to a single n/4 line pass gate. The array 1700 has been simplified by combining the registers and the various pass gate arrays into 'the rectangular segments 1702, 1704, 1706, 1708. Note that the n/4 bit sub-word outputs of each of the register units 1701, 1703, 1705, 1707, provided via buses $Z_1, Z_2, Z_3, Z_4$, are combined via the bus Z to generate a full n-bit word.

The array 1700 is controlled by eight control signals c0–c7 which manage the pass gates and thus output behavior of the array 1700.

Figure 18:
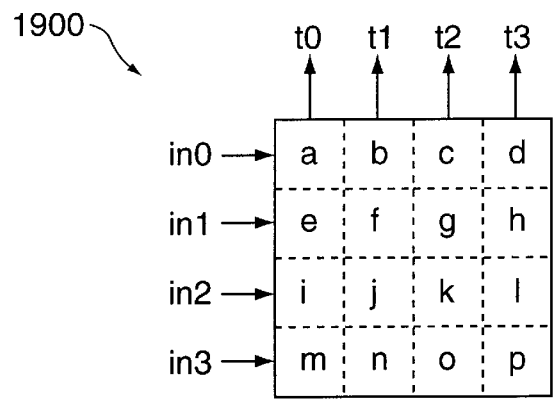
FIG. 18 is a representation of a 4×4 sub-word register array implemented using 4 word registers in accordance with the present invention.

A representation of the atomic two-dimensional register arrays 1600, 1700 is shown in FIG. 18 as a 4×4 sub-word atomic register array 1900. It is similar to the 4×4 register array in FIG. 13 except that there are fewer input and output lines as a result of each word including four sub-words in the FIG. 18 embodiment, as opposed to two sub-words in the FIG. 11 embodiment. That is, in the FIG. 18 example, the SIMD architecture partitions an n-bit register into four pieces. This means that four data items are stored in one register reducing the required number of access signals as compared to the FIG. 13 embodiment. Like the 2×2 sub-word atomic register array 1100 in FIG. 11, the 4×4 sub-word atomic register array 1900 may also be used to form larger structures that are capable of handling larger matrices. For example, four 4×4 sub-word atomic arrays 1900 can be substituted for the 2×2 sub-word atomic arrays illustrated in FIG. 13 to produce an 8×8 two-dimensional register array. This size is particularly useful because it can be used in the processing of compressed digital video information, e.g., MPEG compliant video data.

It should be noted, that although the above description concerns providing the ability to read register data in either normal or transposed form, the same concepts can be applied to enable writing register contents in either normal or transposed form. The "write" version of this invention can be realized by connecting the collection of pass gates, as arranged above, to the inputs of the registers, and by controlling a write strobe for each register so that a register partition will be enabled for writing if, and only if, one of the pass gates feeding its input is active.

New and novel processing instructions for use with the two-dimensional register arrays of the present invention will now be discussed. The new and novel SIMD instructions of the present invention take advantage of the fact that the contents of the two-dimensional register arrays of the present invention can be accessed on a row or column sub-word basis.

An example of a conventional SIMD command, also sometimes referred to as an instruction, is:

MOV R0, R1 where MOV is a move instruction and R0 and R1 are operands which specify the source and destination registers of the data to be copied. Note that data used in conventional SIMD instructions involves the entire contents of the register specified as an operand, e.g., R0.

In accordance with the new and novel instructions of the present invention, a row and/or column of data to be used with a SIMD instruction can be specified as an operand. Such an operand will normally identify both a row or column of register locations, and the particular two-dimensional register array where the specified row or column of register storage locations is located. In this manner, the present invention allows data to be specified in terms of rows or columns of a two-dimensional register array.

Because row/column register array access is supported at a sub-word level, a large number of column/row data manipulations are possible using the data from one or more arrays. For example, data may be copied from a row or column of a register array to another row or column within the register array, data maybe copied from a row of one register array to a row of another register array, from a column of one register array to a column of another register array, from a row of one register array to a column of another register array and/or from a column of one register array to a row of another register array. Rows and columns as well as the register array to which they correspond may be specified, in accordance with the present invention, as command operands.

Figure 19:
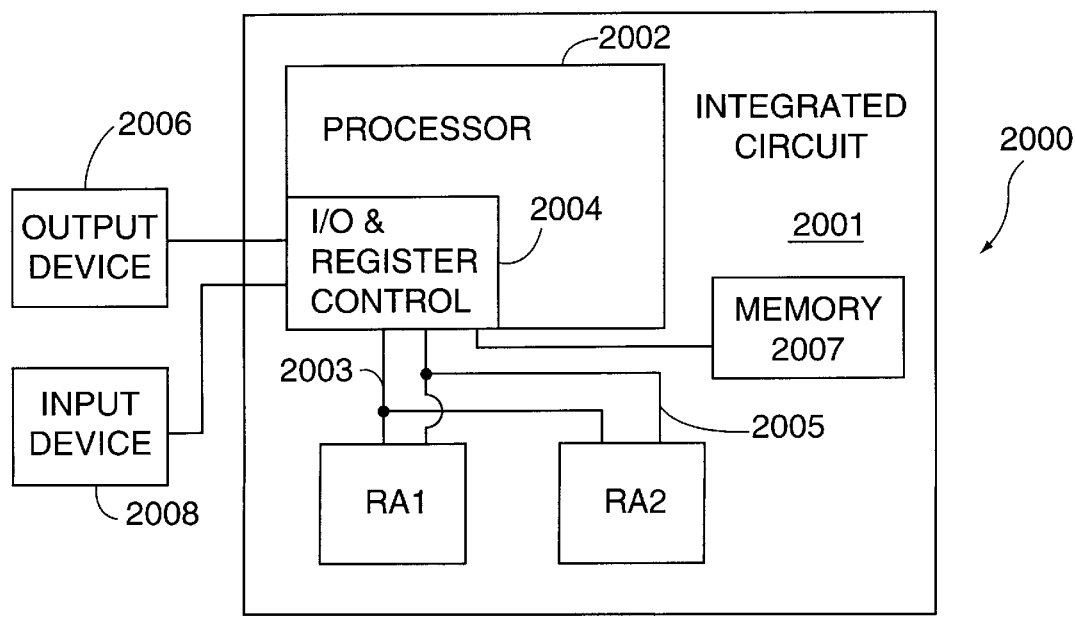
FIG. 19 is a diagram of a processing system implemented in accordance with the present invention.

FIG. 19 illustrates a system 2000 implemented in accordance with the present invention. The system includes an integrated circuit 2001, an output device 2006, e.g., a display, and an input device 2008, e.g., a keyboard. The integrated circuit 2001 includes a processor 2004, memory 2007 and two register arrays RA1 and RA2 implemented in accordance with the present invention. Register arrays RA1 and RA2 are coupled by a data bus 2003 and control lines 2005 to an I/O and register control device 2004 included in the processor 2002. The device includes combination logic for controlling register access under direction of the programmable processor 2002. The memory 2007, output device 2006, and input device 2008 are also coupled to the I/O and register control device 2004.

In accordance with the present invention, instructions, e.g., obtained from memory 2007, involving registers RA1 and RA2, are executed by the processor 2004 via control signals generated by the I/O and register control device 2004.

Figure 20A:
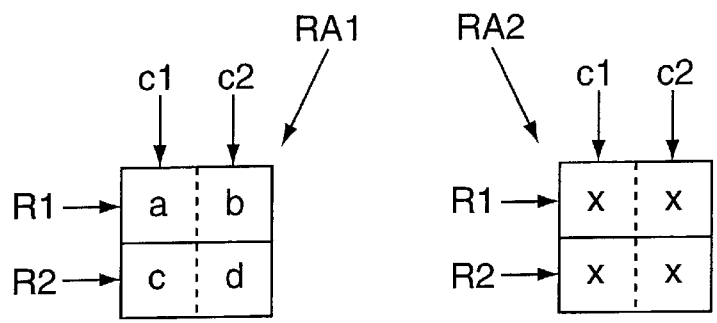

FIG. 20A illustrates the two two-dimensional 2×2 sub-word register arrays RA1 and RA2 in greater detail. The register arrays RA1, RA2 may be implemented using the circuitry of FIG. 10A.

In accordance with the present invention a move instruction may be specified as follows:

MOV (C/R) (RA) (C/R) (RA)

where MOV stands for the instruction move, (C/R) is an operand which identifies a particular column or row of a register array, and (RA) is an operand which identifies a particular register array. The first occurrence of the operands (C/R) (RA) specify the source of the data to be moved while the second occurrence of the operands (C/R)(RA) specify the destination of the data being moved.

For example, consider the instruction:

MOV (C1) (RA1) (R2) (RA2)

Figure 20B:
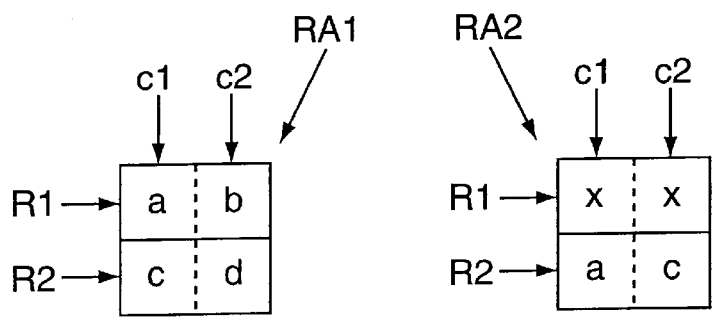

This instruction, when implemented using the registers illustrated in FIG. 20A, results in the register contents being modified to that illustrated in FIG. 20B. Note how sub-words (a, c) found in column 1 of RA1 have been copied to row 2 of RA2.

In addition to the new and novel move command of the present invention discussed above other SIMD commands such as copy, add, sub, etc., may be implemented in accordance with the present invention using operands which specify the row or column of a source register array and the row or column of a destination register array.

A transpose command is also supported by the processor and register array of the present invention illustrated in FIG. 19.

In accordance with the present invention, a transpose command receives as operands a source array identifier and a destination array identifier.

For example, the transpose command may be:

TRNS (RA1) (RA2)

Figure 20C:
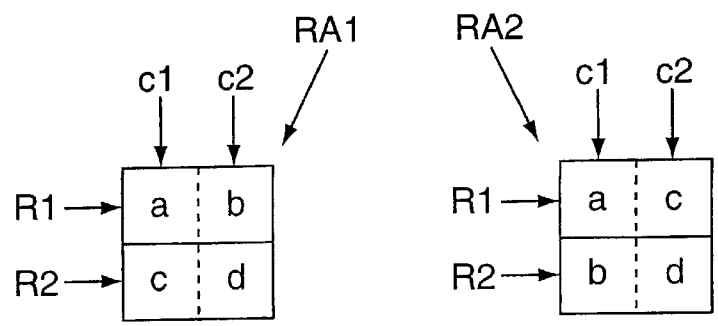

Execution of this command, assuming the register contents were as illustrated in FIG. 20A at the time of execution, would result in the register contents being modified to those illustrated in FIG. 20C.

What is claimed is:

1. An apparatus, comprising:
    a first register assembly including:
        i. a first register having n storage locations, where n is an integer;
        ii. a first pass gate responsive to a first control signal coupled to a first set of said n storage locations; and
        iii. a second pass gate responsive to a second control signal coupled to a second set of said n storage locations, at least one of the storage locations included in the second set being different from the storage locations included in the first set, the first register assembly outputting the data included in the first set of the n storage locations in response to activation of the first control signal and outputting the data included in the second set of the n storage locations in response to activation of the second control signal.

2. The apparatus of claim 1, wherein the first register assembly further includes:
    a third pass gate, responsive to a third control signal, coupled to a third set of the n storage locations.

3. The apparatus of claim 1, wherein the second pass gate is an n-line pass gate having n inputs, each one of the n inputs corresponding to a different one of the n storage locations.

4. The apparatus of claim 2, wherein the first and third pass gates are n/2 line pass gates, the first and third pass gates being coupled to different sets of the n/2 storage locations.

5. The apparatus of claim 4, wherein the second pass gate is an n-line pass gate having n inputs, each one of the n inputs corresponding to a different one of the n storage locations.

6. The apparatus of claim 1, further comprising:
    a second register assembly including:
        i. a second register having n storage locations;
        ii. a fourth pass gate responsive to a fourth control signal coupled to a first set of the second register storage locations; and
        iii. a fifth pass gate, responsive to a fifth control signal coupled to a second set of second register storage locations of the second register, at least one of the storage locations included in the second set of second register storage locations being different from the storage locations included in the first set of second register storage locations.

7. The apparatus of claim 6, wherein the second register assembly further includes:
    a sixth pass gate, responsive to a sixth control signal, coupled to a third set of second register storage locations.

8. The apparatus of claim 6, wherein the fifth pass gate is an n-line pass gate having n inputs, each one of the n inputs corresponding to a different one of the n storage locations of the second register.

9. The apparatus of claim 6, further comprising:
    a plurality of said first and said second register assemblies arranged to form a two-dimensional data storage array.

10. The apparatus of claim 9, further comprising:
    control means for controlling the accessing of n units of data stored in one of the first and second register assemblies at a first time and for controlling the accessing of n/2 units of data stored in each of the first and the second register assemblies at a second time.

11. The apparatus of claim 10, wherein the first and second registers included in the first and second register assemblies are n-bit registers suitable for storing an n-bit word including two n/2 bit sub-words.

12. The apparatus of claim 9, further comprising:
    a processor responsive to a programming instruction for controlling access to the first and second register arrays.

13. The apparatus of claim 10, wherein the first and second registers included in the first and second register assemblies are n-bit registers suitable for storing an n-bit word including four n/4 bit sub-words.

14. The apparatus of claim 5, wherein said first and said second register assemblies are arranged in an array to form an n×n-bit data storage unit.

15. The apparatus of claim 5, further comprising:
    additional first and second register arrays;
    said first and second register arrays and said additional first and second register arrays being combined to form a two-dimensional data storage array.

16. The apparatus of claim 15, further comprising:
    combinational logic used to control access to data stored in said two-dimensional data storage array.

17. The apparatus of claim 9, further comprising:
    a programmable processor coupled to the plurality of first and second register assemblies for generating said control signals used to control access to the first and second register assemblies.

18. The apparatus of claim 17, wherein the first and second register assemblies and programmable processor are implemented as a single integrated circuit.

19. A processing system, comprising:
   a processing unit implemented on a chip;
   a plurality of register arrays implemented on the chip, each register array including a plurality of n-bit registers; and
   at least three pass gates connected to each of the n-bit registers for controlling processor access to data stored in the n-bit registers.

20. The system of claim 19, further comprising:
   control logic for generating pass gate signals in response to programming instructions supplied to the processor which include a register array column as an operand.

21. A device, comprising:
   an integrated circuit including:
      i. a first register having n storage locations, where n is an integer;
      ii. a first switching device responsive to a first control signal coupled to a first set of said n storage locations; and
      iii. a second switching device responsive to a second control signal coupled to a second set of said n storage locations, at least one of the storage locations included in the second set being different from the storage locations included in the first set, the first switching device outputting the data included in the first set of the n storage locations in response to activation of the first control signal, and the second switching device outputting the data included in the second set of the n storage locations in response to activation of the second control signal; and
      iv. a third switching device, responsive to a third control signal, coupled to a third set of the n storage locations.

22. A method of controlling access to data included in a first register array, including multiple n-bit registers, which permits data stored in the first register array to be accessed either on a row or column basis, each entry in a column of data corresponding to a portion of the contents of one of the registers included in the first register array, said portion having fewer than n-bits, the method comprising:
   providing a processor for generating a plurality of register pass gate control signals;
   supplying a first instruction to the processor which includes, as an operand, information identifying a column of the first register array; and
   operating the processor to generate a set of pass gate control signals enabling access to said portions of the registers corresponding to the identified column of data stored in the first register array.

23. The method of claim 22, wherein the first register array is one of a plurality of register arrays, the method further comprising:
   including, as an operand of the first instruction, information identifying the first register array.

24. The method of claim 23, further comprising the steps of:
   including, as an operand of the first instruction, information identifying a second register array and information identifying a row in the second register array;
   operating the processor to generate a set of pass gate control signals enabling access to the identified row of the second register array; and
   storing data in the identified row of the second register array.

25. The method of claim 24, further comprising the step of:
   including control logic in the processor for generating the pass gate signals in response to program instructions.

26. The method of claim 24, further comprising the step of:
   implementing the processor and plurality of register arrays on a single chip.

27. The method of claim 26, wherein the contents of registers included in the register arrays are accessed n bits at a time when a row access operation is performed and less than n bits at a time when a column access operation is performed.

28. The apparatus of claim 1, wherein each of the n storage locations is a one bit storage location.

29. The apparatus of claim 1, wherein the first and second sets of said n storage locations include at least one of said n storage locations which is common to both the first and second sets.

30. The method of claim 4, wherein each of the n bit storage locations is a one bit storage location.

31. The processing system of claim 19, wherein at least two of the three pass gates, connected to each n-bit register, are connected to completely different sets of storage locations included in the register to which the gates are connected.

32. The processing system of claim 31, wherein one of the three pass gates, connected to each n-bit register, is connected to storage locations included in the register to which at least one of the other two of said three pass gates is also connected.

33. The device of claim 21,
   wherein the first set of storage locations includes n/2 storage locations; and
   wherein the second set of storage locations includes n storage locations.

34. The device of claim 21, wherein each storage location is a one bit storage location.

35. The device of claim 21, wherein at least one of the storage locations included in the first set of storage locations is the same as a storage location included in the second set of storage locations.

36. A device, comprising:
   a first register having a first n storage locations, where n is an integer;
   a first switching circuit coupled to a subset of the n storage locations of the first register, the subset of the n storage locations of the first register including fewer than n storage locations, the first switching circuit including a first control signal input for receiving a first control signal, and the first switching circuit operating to control the parallel output of the data included in the subset of the n storage locations of the first register as a function of the first control signal;
   a second register having a second n storage locations;
   a second switching circuit coupled to a subset of the n storage locations of the second register, the subset of the n storage locations of the second register including fewer than n storage locations, the second switching circuit including a second control signal input for receiving a second control signal, and the second switching circuit operating to control the parallel output of the data included in the subset of the n storage locations of the second register as a function of the second control signal; and means for combining the data output by the first and second switching circuits.

37. The device of claim 36, wherein each of the n storage locations of the first and second registers is a one bit storage location; and wherein the means for combining the data output by the first and second switching circuits includes circuitry for generating an n-bit word from the data output by the first and second switching circuits.

38. The device of claim 37, further comprising:

a third switching circuit coupled to the n storage locations of the first register, the third switching circuit being responsive to a third control signal to output n-bits stored in the n storage locations of the first register; and a fourth switching circuit coupled to the n storage locations of the second register, the fourth switching circuit being responsive to a fourth control signal to output n-bits stored in the n storage locations of the second register.

* * * * *